(12) United States Patent
Duong et al.

(10) Patent No.: US 10,415,810 B2
(45) Date of Patent: Sep. 17, 2019

(54) SYSTEMS AND METHODS FOR LIGHTING FIXTURES

(71) Applicant: Fluence Bioengineering, Austin, TX (US)

(72) Inventors: Dung Duong, Austin, TX (US); Randy Johnson, Austin, TX (US); Nick Klase, Austin, TX (US)

(73) Assignee: Fluence Bioengineering, Inc., Austin, TX (US)

( * ) Notice: Subject to any disclaimer, the term of this patent is extended or adjusted under 35 U.S.C. 154(b) by 0 days.

(21) Appl. No.: 15/688,358

(22) Filed: Aug. 28, 2017

(65) Prior Publication Data

US 2018/0356077 A1 Dec. 13, 2018

Related U.S. Application Data

(60) Provisional application No. 62/516,412, filed on Jun. 7, 2017.

(51) Int. Cl.
*F21V 23/00* (2015.01)
*H05K 1/05* (2006.01)
(Continued)

(52) U.S. Cl.
CPC ............ *F21V 23/005* (2013.01); *A01G 7/045* (2013.01); *F21K 9/232* (2016.08); *F21K 9/90* (2013.01); *F21S 4/28* (2016.01); *F21V 7/005* (2013.01); *F21V 7/0066* (2013.01); *F21V 7/05* (2013.01); *F21V 15/015* (2013.01); *F21V 17/107* (2013.01); *F21V 19/003* (2013.01); *F21V 19/0015* (2013.01); *F21V 23/001* (2013.01); *F21V 23/02* (2013.01); *F21V 29/70* (2015.01); *F21V 29/74* (2015.01); *F21V 29/83* (2015.01); *H05K 1/0203* (2013.01); *H05K 1/0209* (2013.01); *H05K 1/0274* (2013.01); *H05K 1/0277* (2013.01); *H05K 1/05* (2013.01); *H05K 1/056* (2013.01); *H05K 1/181* (2013.01); *H05K 1/182* (2013.01); *H05K 1/185* (2013.01); *H05K 3/0014* (2013.01); *H05K 3/28* (2013.01); *H05K 3/32* (2013.01); *H05K 3/44* (2013.01); *F21Y 2103/10* (2016.08); *F21Y 2105/16* (2016.08); *F21Y 2115/10* (2016.08);
(Continued)

(58) Field of Classification Search
USPC .................................................. 362/249.01
See application file for complete search history.

(56) References Cited

U.S. PATENT DOCUMENTS

| 2011/0286207 | A1* | 11/2011 | Chan .................... F21V 15/013 362/217.1 |
| 2012/0212944 | A1* | 8/2012 | Whitfield ................. F21L 4/00 362/184 |

(Continued)

OTHER PUBLICATIONS

Young, Lee W., International Search Report and Written Opinion of the International Searching Authority, for counterpart application PCT/US2018/034544, dated Aug. 24, 2018, U.S. Patent and Trademark Office, Alexandria, Virginia, U.S., 3 pages.

*Primary Examiner* — Rafferty D Kelly
(74) *Attorney, Agent, or Firm* — Yutian Ling

(57) ABSTRACT

Examples of the present disclosure are related to systems and methods for lighting fixtures. More particularly, embodiments disclose lighting fixtures utilizing metal core PCB (MCPCB) for thermal, mechanical, and/or optical controls.

12 Claims, 4 Drawing Sheets

(51) Int. Cl.
*H05K 1/18* (2006.01)
*H05K 1/02* (2006.01)
*H05K 3/32* (2006.01)
*F21K 9/90* (2016.01)
*F21V 29/74* (2015.01)
*F21V 29/70* (2015.01)
*F21V 29/83* (2015.01)
*F21K 9/232* (2016.01)
*A01G 7/04* (2006.01)
*F21V 7/00* (2006.01)
*F21V 7/05* (2006.01)
*H05K 3/00* (2006.01)
*H05K 3/28* (2006.01)
*H05K 3/44* (2006.01)
*F21S 4/28* (2016.01)
*F21V 15/015* (2006.01)
*F21V 17/10* (2006.01)
*F21V 19/00* (2006.01)
*F21V 23/02* (2006.01)
*H05B 33/08* (2006.01)
*H05B 37/02* (2006.01)
*F21Y 115/10* (2016.01)
*F21Y 105/16* (2016.01)
*F21Y 103/10* (2016.01)

(52) U.S. Cl.
CPC ...... *H05B 33/0854* (2013.01); *H05B 37/0227* (2013.01); *H05B 37/0272* (2013.01); *H05K 2201/066* (2013.01); *H05K 2201/09009* (2013.01); *H05K 2201/10106* (2013.01)

(56) References Cited

U.S. PATENT DOCUMENTS

2013/0039050 A1  2/2013  Dau et al.
2014/0160740 A1  6/2014  Hwang et al.

* cited by examiner

SYSTEMS AND METHODS FOR LIGHTING FIXTURES

CROSS-REFERENCE TO RELATED APPLICATIONS

This application claims a benefit of priority under 35 U.S.C. § 119 to Provisional Application No. 62/516,412 filed on Jun. 7, 2017, which is fully incorporated herein by reference in their entirety.

BACKGROUND INFORMATION

Field of the Disclosure

Examples of the present disclosure are related to systems and methods for lighting fixtures. More particularly, embodiments disclose lighting fixtures utilizing bends in metal-core PCB (MCPCB) and orthogonal braces for thermal, mechanical, and/or optical controls.

Background

Controlled environment agriculture, especially vertical farming is becoming more prevalent in the US and around the world. Vertical farming relies on light fixtures to illuminate a plant canopy. The light fixtures uniformly distribute radiant flux over the plant canopy, while removing heat from light sources (typically LEDs). The light fixtures' efficacy and cost directly impacts the operational expenses associated with vertical farming. As fixture height directly influences a number of vertical layers within a growth volume, it is important to minimize a form factor or vertical height of the fixture Operating higher-powered lights in a vertical growth is more costly than utilizing free sunlight in greenhouses or field-grown. To overcome these costs, vertical farming must have an increased yield, shorter growth cycles, more consistent product, less water usage, farm to plate timeframe, high nutrient content, and other tangible advantages.

Although light emitting diodes (LEDs) used in vertical farming are more efficient than traditional higher-powered lights, their manufacturing costs are also higher. Additionally, their performance is negatively impacted with thermal rise. The terminal rise requires the light fixtures to dissipate heat more efficiently. This generated heat causes issues such as decreased longevity and lower fixture efficacy. To circumvent the requirements to dissipate the heat, some manufacturers have built complex LED fixtures. This has led to conventional LED fixtures being coupled to heat sinks.

This has led to conventional LED fixtures being coupled to heat sinks. Conventional LED fixtures utilize LEDs that are positioned on a printed circuit board. PCB substrates may be made of different materials such as FR4, Aluminum, copper, etc. In most application, an insulative substrate is necessary such as FR4. In high power applications, a highly thermally conductive substrate is desired. For LEDs, thermal dissipation is paramount and therefore Aluminum substrates are often utilized. When metal is used as the substrate, the term metal core printed circuit board is used or more commonly MCPCB. The linear MCPCB is then coupled to the heatsink to dissipate the heat. The process leads to inefficient thermal transfer or increased thermal resistance between the heat source (LEDs) and the heatsink. This process to affix the LEDs to the MCPCB and then to couple the MCPCB to the heat sink requires time and resources. This can be an arduous, time consuming, and costly task.

Accordingly, needs exist for more effective and efficient systems and methods for light fixtures systems with supports that extend in a direction orthogonal to the bends of the heat sink.

SUMMARY

Embodiments disclosed herein describe systems and methods for a light fixture that utilizes MCPCB for thermal, mechanical, and/or optical controls. In embodiments, a MCPCB sheet may be directly populated with electronic components, such as LEDS, connectors, fuses, etc. The board may then be coated for protection. The MCPCB sheet may then be cut into a single panel. Next, the single panel MCPCB is bent at least one time, wherein the bend may increase the rigidity and mechanical strength of the system, be more aesthetically pleasing, and allow for thermal and optical controls. The bent MCPCB panel can then be assembled into a light fixture. The light fixture may include a plurality of bent panels that are coupled together by endcaps.

The endcaps may be positioned on first ends and second ends of the bent panels. The endcaps may be configured to give the system mechanical strength in a direction that is perpendicular to the bends in the panels, while also allowing multiple bent panels to be coupled together. Furthermore, electrical components may be configured to be positioned through and/or embedded within the endcaps to reduce the footprint, sizing, etc. of the system.

In embodiments, multiple endcaps on the first ends and/or second ends may be coupled together via a hinge. The hinge may allow for multiple sections of the system to be folded over itself while not in use, while sharing a same power supply when in use.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
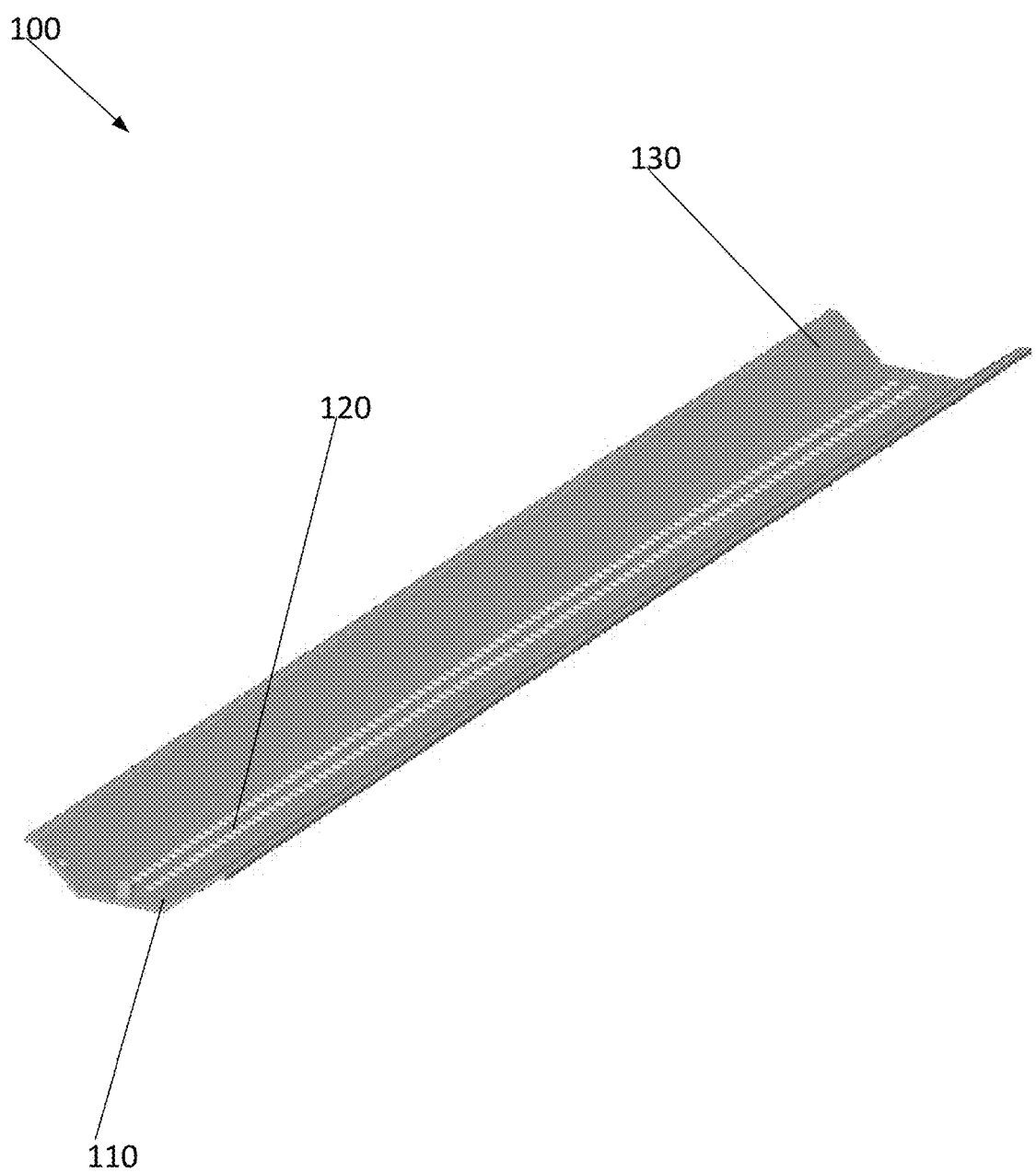
FIG. 1 depicts a MCPCB LED bar system, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

FIG. 1 depicts a MCPCB LED bar system 100, according to an embodiment. System 100 may be configured to utilize bends in a MCPCB lighting fixture for thermal, mechanical, and optical controls. System 100 may include MCPCB 110, light sources 120, and bends 130. Utilizing bends 130, MCPCB 110 may be substantially isothermal having somewhat uniform temperatures across MCPCB 110.

MCPCB 110 may be formed of any metal, including: copper, 3003 AL, 5052 AL, and/or other desired metals. In specific implementations, MCPCB 110 may be formed of a metal or substrate with a very low emissivity. However such a system would be much larger than a system with a high emissivity platform. To increase the emissivity of the MCPCB 110, MCPCB 110 may be anodized, may have a solder mask that yields higher emissivity that anodized aluminum, and/or have a painted surface that yields higher emissivity than anodized aluminum. MCPCB 110 may be positioned in a panel having a longer longitudinal axis than a lateral axis. MCPCB 110 may have a thickness that is based on the thermal properties generated by light sources 120. For example, MCPCB 110 may have a thickness that is around 1.6 mm.

Light sources 120 may be light emitting diodes (LEDs) or any other device that is configured to emit light. Light sources 120 may be directly embedded or positioned on MCPCB 110, such that additional operations to affix tape or thermal adhesives to MCPCB 110, a heat sink, or both are not required. Light sources 120 may be positioned from a first end of MCPCB 110 to a second end of MCPCB 110. Light sources 120 may be configured to generate heat in response to creating and emitting light. Light sources 120 may be arranged on MCPCB 110 in a plurality of rows, or in any predetermined layout to generate a desired light pattern on an area of interest positioned below system 100. In embodiments, the rows of light sources 120 may be symmetrically placed around and/or through the central axis of MCPCB 110 to emit an even light pattern and to generate even amounts of heat. However, in other embodiments, the lights sources 120 may be asymmetrically positioned to generate a desired light pattern on a region of interest.

Bends 130 may be positioned from the first end to the second end of MCPCB 110. Bends 130 may be configured to add rigidity and/or mechanical strength to system 100, add form for aesthetics, operate as a heat sink to guide the flow of air, and allow for optical controls. Bends 130 may be positioned at an angle that is perpendicular to MCPCB 110 or positioned at an angle that is downward and away from a central axis of MCPCB 110. By angling bends 130 away from the central axis and towards a lower surface, thermal performance of system 100 may be increased. More specifically, air that is heated by light sources 120 (and other electronics) under MCPCB 110, may travel towards the lower distal ends of bends 130, around the distal ends of bends 130, and upwards towards the central axis of system 100 positioned above MCPCB 110.

The heights of bends 130 may be based on the length of MCPCB 110, wherein the heights of bends may be the vertical distance from the distal ends of bends 130 to the upper surface of MCPCB 110. In embodiments, where the length of MCPCB 110 is longer the height of bends 130 may be taller, and where the length of MCPCB 110 is shorter the height of bends 130 may be shorter.

In embodiments, based on the geometric properties of bends 130, bends 130 may be utilized for optical control of the light emitted from light sources 120. Specifically, the bends 130 may be used as a diffuse/speculator reflector for the light emitted from light sources 120. This may enable system 100 to alter, change, and/or create a desirable light pattern on an area of interest below system 100.

In embodiments, the angles, lengths, heights, and/or other geometrical properties of bends 130 may be symmetrical across the central axis such that MCPCB 110 is isothermal. Yet, in other implementations, the angles, lengths, heights, and/or other geometric properties of bends 130 may be asymmetric.

Figure 2:
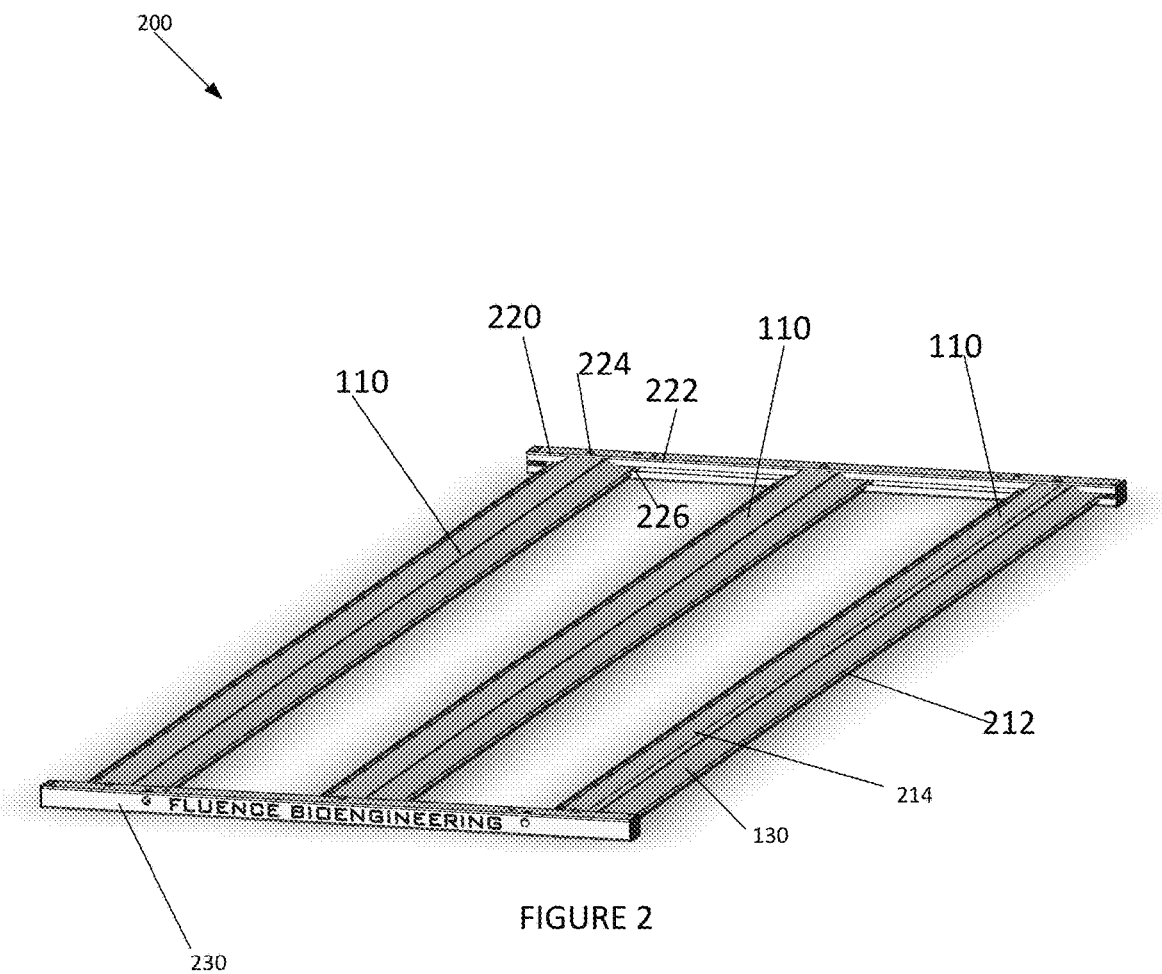
FIG. 2 depicts a MCPCB fixture, according to an embodiment.

FIG. 2 depicts a MCPCB fixture 200, according to an embodiment. Elements depicted in FIG. 2 may be described above, and for the sake of brevity an additional description of these elements is omitted.

As depicted in FIG. 2, fixture 200 may include a plurality of bent MCPCBs 110. Each of the MCPCBs 110 may be aligned in parallel with each other. The outer ends of bends 130 may include a flat, planar surface 212 that extends in parallel to an upper surface 214 of MCPCBs 110. Planar surface 212 may be utilized to couple the ends of MCPCB to endcaps 220, 230.

Endcaps 220, 230 may be polymer or metal (al, steel) endcaps that are configured to couple the ends of plurality of MCPCBs 110 together. Furthermore, endcaps 220, 230 may be configured to be positioned orthogonal to the bends 130. By positioning endcaps 220, 230 in a direction orthogonal to bends 130, endcaps 220, 230 may supply mechanical rigidity and support to fixture 200 in a lateral axis of fixture 200. Endcaps 220, 230 may include a rail 222, upper coupling mechanism 224, and lower coupling mechanism 226.

Rail 222 may be a hollow channel, chamber, passageway that extends from a first side of rail endcap 220, 230 to a second side of endcap 220, 230 along the lateral axis of fixture 200. Rails 222 may allow MCPCBs 110 to slide along the lateral axis of fixture 200 before being couple to endcaps 220, 230. Rail 222 may be configured to receive corresponding ends of MCPCBs 110 to couple MCPCBs to rails 222. Furthermore, rail 222 may be configured to allow electrical components and other elements of fixture 200 to be housed within the chamber. This may eliminate the amount of exposed electrical components and other elements of fixture 200.

Upper coupling mechanism 224 may be systems and mechanisms configured to couple upper surface 214 of MCPCBs to endcaps 220, 230. Upper coupling mechanisms 224 may include screws, bolts, clasps, etc.

Lower coupling mechanism 226 may be systems and mechanisms configured to couple planar surfaces 212 to endcaps 220, 230. Lower coupling mechanisms 226 may include screws, bolts, clasps, etc. By coupling MCPCBs 110 to endcaps 220, 230 at multiple locations at different vertical and horizontal offsets, MCPCBs 110 may be securely affixed to endcaps 220, 230.

Figure 3:
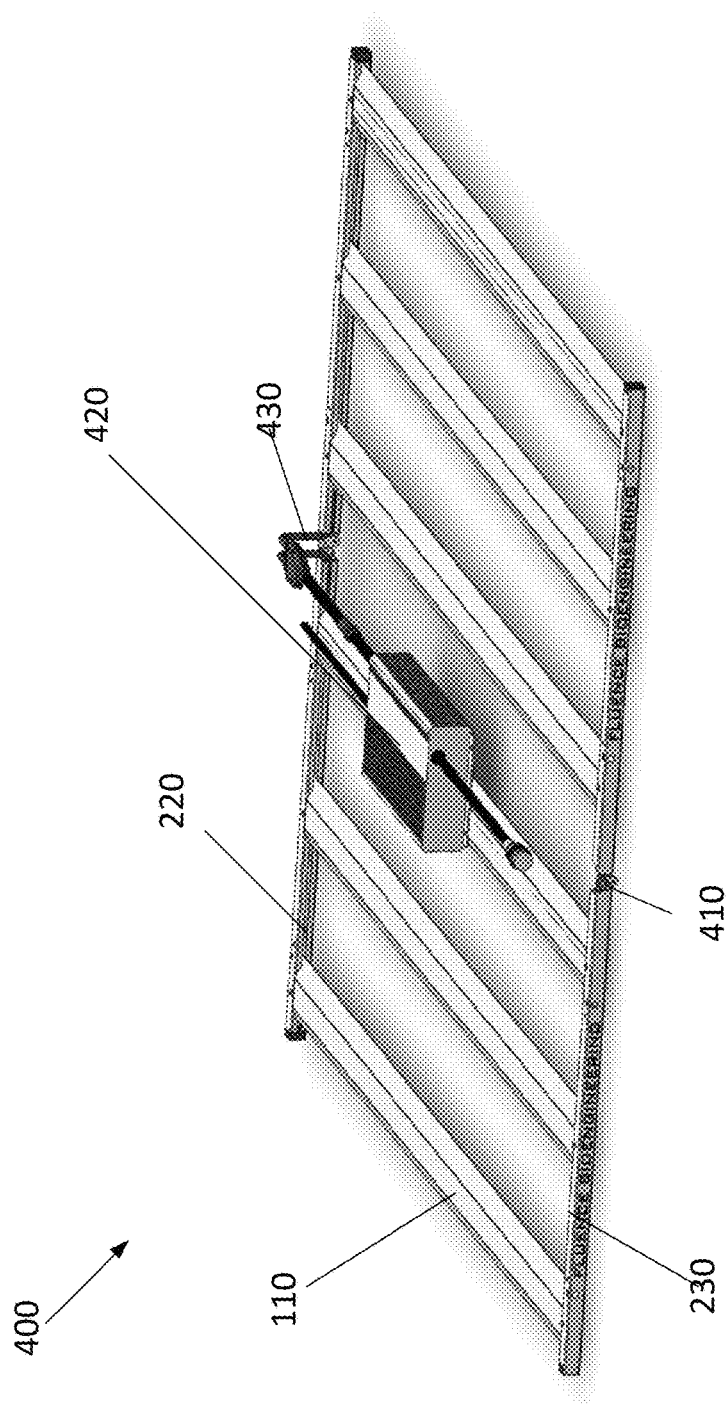
FIG. 3 depicts a MCPCB fixture, according to an embodiment.

FIG. 3 depicts a MCPCB fixture 400, according to an embodiment. Elements depicted in FIG. 4 may be described above, and for the sake of brevity an additional description of these elements is omitted. Furthermore, elements described in fixture 400 may be combined with other fixtures, such as fixtures 100, 200, 300 or be used independently.

As depicted in FIG. 3, a first set of MCPCBs 110 may be coupled together via endcaps 220, 230, and a second set of MCPCBs 110 may be coupled together via endcaps 220, 230. In embodiments, the first set and second set of MCPCBs 110 may have the same number or different numbers of MCPCBs. The first and second sets of MCPCBs 110 may utilize the same power supply 420. Electronic components 430 and wiring associated with power supply 420 may be run through rails 220.

In embodiments, the first and second sets of MCPCBs 110 may be coupled together via hinges 410, which may be positioned between endcaps 220, 230 on the same sides of fixture 400. Hinges 410 may allow fixture 400 to fold over itself along the longitudinal axis of fixture 400. This may allow fixture 400 to have a smaller width during transportation and installation.

Figure 4:
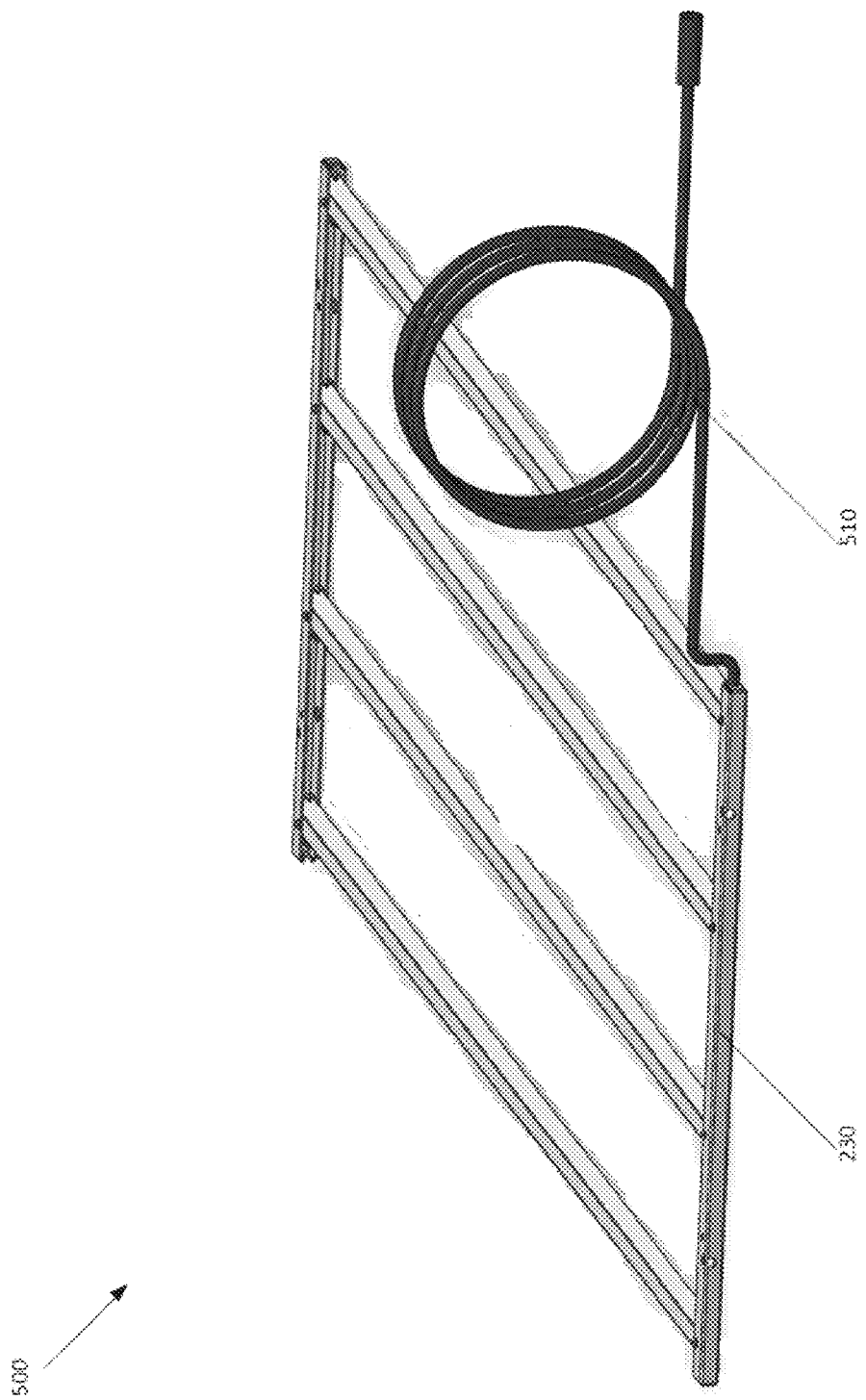
FIG. 4 depicts a MCPCB fixture, according to an embodiment.

FIG. 4 depicts an embodiment of MCPBC fixture 500, according to an embodiment. Elements depicted in FIG. 4 may be described above, and for the sake of brevity an additional description of these elements is omitted. Furthermore, elements described in fixture 500 may be combined with other fixtures, such as fixtures 100, 200, 300, 400 or be used independently.

As depicted in FIG. 4, electrical wiring 510 may be run through rails 230. This may reduce the physical space required to house fixture 500.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

The flowcharts and block diagrams in the flow diagrams illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

What is claimed is:

1. A light fixture system comprising:
a first set of substrates positioned in parallel to each other having at least one bend extending along a longitudinal axis of each of the substrates, wherein:
the first set of substrates includes a plurality of substrates; and
each of the substrates within the first set of substrates includes an upper surface and a flat and planar surface positioned on an opposite side of the at least one bend as the flat upper surface, wherein the upper surface and the flat and planar surface are positioned in parallel to each other at different vertical offsets;
a first endcap being coupled to first ends of each of the substrates within the first set of substrates, the first endcap including a hollow channel extending from a proximal end to a distal end of the first endcap, wherein the first ends of each of the substrates is configured to be inserted into the hollow channel; and
a second endcap being coupled to second ends of each of the substrates within the first set of substrates, the first endcap and the second endcap extending in a direction that is orthogonal to the longitudinal axis of each of the substrates within the first set of substrates.

2. The system of claim 1, wherein a first end of the upper surface and a first end of the flat and planar surface are configured to be positioned within the hollow channel.

3. The system of claim 2, wherein each of the substrates within the first set of substrates are configured to be coupled to the first endcap at the upper surface and the flat and planar surface via coupling mechanisms.

4. A light fixture system comprising:
a first set of substrates positioned in parallel to each other having at least one bend extending along a longitudinal axis of each of the substrates, wherein the first set of substrates includes a plurality of substrates;
a first endcap being coupled to first ends of each of the substrates within the first set of substrates, the first endcap including a hollow channel extending from a proximal end to a distal end of the first endcap, wherein the first ends of each of the substrates is configured to be inserted into the hollow channel;
a second endcap being coupled to second ends of each of the substrates within the first set of substrates, the first endcap and the second endcap extending in a direction that is orthogonal to the longitudinal axis of each of the substrates within the first set of substrates;
a second set of substrates, the second set of substrates being positioned in parallel with the first set of substrates, wherein the second set of substrates includes a plurality of substrates;
a third endcap being coupled to first ends of each of the substrates with the second set of substrates;
a fourth endcap being coupled to second ends of each of the substrates within the second set of substrates;
a first coupling mechanism being configured to couple the first endcap and the third endcap;
a second coupling mechanism being configured to couple the second endcap and the fourth endcap;

wherein the first coupling mechanism is a hinge, the hinge being configured to change an angle between the first set of substrates relative to the second set of substrates.

5. The system of claim 4, further comprising:
a power source configured to supply power to lights positioned on the first set of substrates and the second set of substrates.

6. The system of claim 4, wherein in a transportation mode the first set of substrates are rotated in a first direction via a hinge to be positioned adjacent to each other on a same side of the hinge, and in a use mode the first set of substrates are rotated in a second direction via the hinge to be positioned in a same plane as the second set of substrates.

7. A method for a light fixture comprising:
coupling a first endcap to first ends of each substrate within a first set of substrates, each of substrates within the first set of substrates having at least one bend extending along a longitudinal axis of each of the substrates within the first set of substrates, wherein:
the first set of substrates includes a plurality of substrates positioned in parallel to each other;
each substrate with the first set of substrates is coupled to the first endcap by inserting first ends of each substrate within the first set of substrates within a hollow channel, the hollow channel extending from a proximal end to a distal end of the first endcap; and
each of the substrates within the first set of substrates includes an upper surface, and a flat and planar surface positioned on an opposite side of the at least one bend as the flat upper surface, wherein the upper surface and the flat and planar surface are positioned in parallel to each other at difference vertical offsets; and
coupling a second endcap to second ends of each of the substrates within the first set of substrates, the first endcap and the second endcap extending in a direction that is orthogonal to the longitudinal axis of each of the substrates within the first set of substrates.

8. The method of claim 7, further comprising:
positioning a first end of the upper surface and a first end of the flat and planar surface within the hollow channel.

9. The method of claim 8, further comprising:
coupling each of the substrates within first set of substrates to the first endcap at the upper surface and the flat and planar surface via coupling mechanisms.

10. A method for a light fixture comprising:
coupling a first endcap to first ends of each substrate within a first set of substrates, each of substrates within the first set of substrates having at least one bend extending along a longitudinal axis of each of the substrates within the first set of substrates, wherein the first set of substrates includes a plurality of substrates positioned in parallel to each other, and each substrate with the first set of substrates is coupled to the first endcap by inserting first ends of each substrate within the first set of substrates within a hollow channel, the hollow channel extending from a proximal end to a distal end of the first endcap;
coupling a second endcap to second ends of each of the substrates within the first set of substrates, the first endcap and the second endcap extending in a direction that is orthogonal to the longitudinal axis of each of the substrates within the first set of substrates;
coupling a third endcap to first ends of each substrate within a second set of substrates, wherein the second set of substrates includes a plurality of substrates;
coupling a fourth endcap to second ends of each substrate within the second set of substrates;
coupling the first endcap and the third endcap together via a first coupling mechanism;
coupling the second endcap and the fourth endcap together via a second coupling mechanism, wherein each of the substrates within the second set of substrates being positioned in parallel with the substrates within first set of substrates;
changing an angle between the first set of substrates and the second set of substrates via the first coupling mechanism positioned between the first set of substrates and the second set of substrates, wherein the first coupling mechanism is a hinge.

11. The method of claim 10, further comprising:
supplying power, via a power source, to lights positioned on the first set of substrates and the second set of substrates.

12. The method of claim 10, wherein in a transportation mode the first set of substrates are rotated in a first direction via a hinge to be positioned adjacent to each other on a same side of the hinge, and in a use mode the first set of substrates are rotated in a second direction via a hinge to be positioned in a same plane as the second set of substrates.

* * * * *